United States Patent
Wang et al.

(10) Patent No.: US 7,458,008 B2
(45) Date of Patent: *Nov. 25, 2008

(54) DECISION VOTING IN A PARALLEL DECODER

(75) Inventors: Bo Wang, North Potomac, MD (US); Adrian R. Macias, Oceanside, CA (US)

(73) Assignee: Freescale Semiconductor, Inc., Austin, TX (US)

( * ) Notice: Subject to any disclaimer, the term of this patent is extended or adjusted under 35 U.S.C. 154(b) by 347 days.

This patent is subject to a terminal disclaimer.

(21) Appl. No.: 11/024,803

(22) Filed: Dec. 30, 2004

(65) Prior Publication Data

US 2006/0150056 A1    Jul. 6, 2006

(51) Int. Cl.
    *H03M 13/00* (2006.01)
(52) U.S. Cl. ....................... 714/796; 714/795
(58) Field of Classification Search ................ 714/796, 714/795
    See application file for complete search history.

(56) References Cited

U.S. PATENT DOCUMENTS

| | | | | |
|---|---|---|---|---|
| 5,408,502 A | | 4/1995 | How | |
| 5,856,987 A | * | 1/1999 | Holman | 714/752 |
| 5,881,075 A | * | 3/1999 | Kong et al. | 714/795 |
| 5,917,859 A | | 6/1999 | Yamasaki et al. | |
| 6,041,431 A | * | 3/2000 | Goldstein | 714/784 |
| 6,088,404 A | * | 7/2000 | Jekal | 375/341 |
| 6,259,749 B1 | * | 7/2001 | Andoh | 375/341 |
| 6,304,617 B1 | * | 10/2001 | Okamoto | 375/341 |
| 6,317,472 B1 | * | 11/2001 | Choi et al. | 375/341 |
| 6,477,680 B2 | * | 11/2002 | Mujtaba | 714/795 |
| 2004/0243916 A1 | * | 12/2004 | Kim et al. | 714/796 |

OTHER PUBLICATIONS

Search Report from Patent Cooperation Treaty issued on Jan. 9, 2007 for the corresponding PCT patent application No. PCT/US05/45543.
Notification Concerning Transmittal of International Preliminary Report on Patentability dated Jul. 12, 2007 in corresponding PCT application No. PCT/US2005/045543.

* cited by examiner

*Primary Examiner*—M. Mujtaba K Chaudry

(57) ABSTRACT

A method (700) and apparatus (600) are described for performing decision voting in connection with a parallel ACS unit (110) and track buffer (112) in an Ultrawide Bandwidth (UWB) receiver having a parallel DECODER for decoding a message sequence encoded according to a convolutional code. Outputs from the track buffer can be input to a voting unit (620) where a voting scheme can be applied and a decision rendered as to the originally transmitted message sequence.

14 Claims, 4 Drawing Sheets

DECISION VOTING IN A PARALLEL DECODER

CROSS-REFERENCE TO RELATED APPLCATIONS

The present invention is related to co-pending applications entitled "PARALLEL DECODER FOR ULTRAWIDE BANDWIDTH RECEIVER," filed Dec. 30, 2004, and "TRACK BUFFER IN A PARALLEL DECODER," filed Dec. 30, 2004, the contents of both of which are hereby incorporated by reference in their entirety.

FIELD OF THE INVENTION

The present invention relates in general to wireless communication systems, such as ultrawide bandwidth (UWB) systems, including UWB receivers, mobile receivers and transceivers, centralized receivers and transceivers, and related equipment. More specifically, the present invention relates to decision voting associated with a decision bit determined from decision bits generated from a track buffer in a parallel decoder used in such devices.

BACKGROUND OF THE INVENTION

As ultrawide bandwidth (UWB) communication becomes increasingly desirable for wireless devices due to its speed and capacity combined with its resilience to interference within high-frequency bands, it is increasingly necessary to adopt effective error correction and related coding methods for maintaining step with the high accuracy demands associated with UWB communication. It should be noted that a UWB signal may be defined, in accordance with, for example, The Federal Communications Commission "First Report and Order, Revision of Part 15 of the Commission's Rules Regarding Ultra-Wideband Transmission Systems," ET Docket 98-153, Feb. 14, 2002 as any signal occupying more than 500 MHz in the unlicensed 3.1-10.6 GHz band and meeting a specified energy spectrum or energy spectral density mask. As with many engineering challenges, two predominant constraints guide design activities associated with a UWB system: application speed and power consumption. To address these concerns, various coding schemes can be used to optimize speed and error resiliency while maintaining power consumption at acceptable levels. Thus coding performance and complexity are of great concern in UWB systems.

Convolutional codes are a common choice for coding a continuous sequence of message symbols and provide useful coding performance for UWB systems. For many reasons, convolutional codes can provide power savings due to inherent characteristics of the code and because the error correcting capabilities of the code reduce the requirement for retransmission which can also contribute greatly to saving power on both the transmitter and receiver sides. As will be appreciated by one of ordinary skill, in a convolutional encoder, one message symbol of k bits can be encoded into one code symbol of n code bits, with k and n typically being small integers and with k<n, resulting in a code with a rate of k/n. A typical encoder can be constructed as a shift register plus a series of n connection groups to n summing nodes which produce an n-bit codeword output based on a message symbol input bit and the contents of the shift register. The constraint length K of the encoder is generally taken to be the length of the encoder shift register plus one. Another common parameter used in describing encoders is M which is taken to mean the number of shift register or memory elements. Thus, in the case of a code with a rate of ½, and a constraint length of M=3 (K=4), a typical convolutional encoder for such a code can be described as, for example, a finite state machine (FSM) with $2^M$, or 8 states.

In a conventional trellis decoder used for decoding convolutionally encoded signals, the speed at which at which a codeword can be processed is proportional to the trellis depth, or the number of possible state transitions required to converge on the correct message word. Thus for code symbols received at a code rate $r_n$, a decoding operation must perform fast enough to generate the recovered message symbol at the message symbol rate $r_k$. Since, in a conventional trellis decoder, decisions are made only after the trellis is traversed and the surviving path calculated, the trellis depth can have a large impact on the processing speed required to meet the requirement of generating recovered symbols at the symbol rate. A trellis depths even as short as 2 or 3, double and triple the processing speed required to decode the message symbol at the original message symbol rate leading to unsuitable decoding speeds for high speed transmissions such as transmissions within the UWB symbol rate ranges. Since the trellis depth is a function of the constraint length of the code, and can affect the Forward Error Correction (FEC) capability of the code, along with other desirable features of the code, it would be desirable in the art for a method and apparatus for rapidly decoding a received sequence encoded according to a convolutional code without sacrificing the power savings and other benefits associated with code constraint selection.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages in accordance with the present invention.

DETAILED DESCRIPTION OF PREFERRED EMBODIMENTS

The present invention provides comparatively low complexity, low power consumption and high speed forward error correction (FEC) in UWB receivers through the use of a parallel track buffer for storing and processing results obtained through trellis decoding, such as Viterbi decoding, of a convolutionally encoded message sequence. The track buffer of the present invention in connection with a parallel trellis decoder reduces decoding time by eliminating the need to iteratively traverse the decoder trellis and by maintaining, through register exchange or the like as will be described, a current surviving path metric for every input code symbol leading to a message symbol or message bit decision. Thus, decoded message symbols can be generated at the symbol rate, an achievement which is not generally possible using alternate designs such as conventional iterative, that is, non-parallel, decoder designs including some designs which purport to be at least partially parallel. The present invention accomplishes fast decoding while maintaining acceptable power levels and error correction performance levels associated with convolutional coding.

Figure 1:
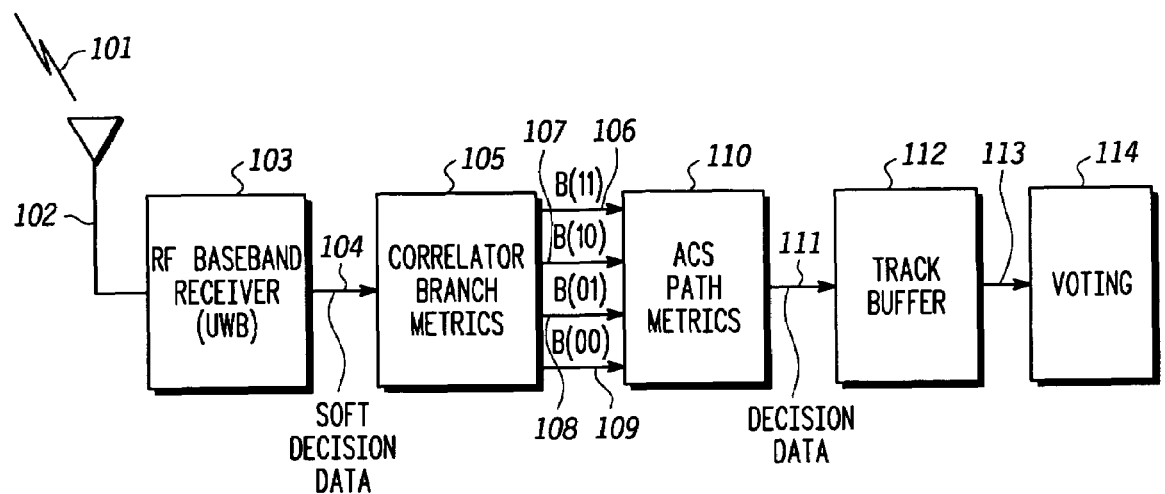
FIG. 1 is a block diagram illustrating blocks associated with an exemplary Ultra Wide Band (UWB) receiver in accordance with various exemplary embodiments of the present invention.

A series of stages in an exemplary receiver 100 is shown in FIG. 1. As will be appreciated by those of ordinary skill in the art, convolutional codes as noted above are generated by subjecting a sequence of message symbols to coding operations in a convolutional encoder (not shown). The convolutional encoder applies n generator polynomials to the message sequence to generate a code word having n symbols for every message symbol. A typical convolutional encoder is configured either in hardware, in software, or in a combination of hardware and software, as a linear shift register with M storage locations and n different sets of connections between n respective summation nodes and various combinations of registers within the shift register corresponding to n respective generator polynomials. Each connection set corresponds to a generator polynomial and is associated with one of the n code symbol outputs associated with code words of the convolutional code. In a ½ rate code, for example, 2 code symbols are generated for every 1 received message symbol and thus 2 sets of connections to the encoder shift register corresponding to the generator polynomials for the code are used to generate the 2 code symbols for each code word.

Each of the unique sets of connections to the input shift register associated with the $n^{th}$ generator are exclusive ORed to form the code symbol for the $n^{th}$ generator and the n code symbols from the n code generators are multiplexed such that n code symbols are generated for every k input symbols at the input symbol rate. Code symbols are transmitted at baseband frequency and received as a UWB signal 101 at an exemplary receiver 100.

As noted above and as shown in Table 1, in accordance with various exemplary embodiments, a message sequence can be encoded with a convolutional code with a rate of ½, and having a constraint length K=6 to achieve a good range performance for various modes. Given a code rate of ½, or a punctured rate of, for example, ¾ for optional modes, the choice of constraint K=6 offers an excellent performance vs. complexity trade-off, requiring, for example, only half the complexity of a code with a constraint K=7. It should incidentally be noted that a convolutional code used in connection with a convolutional interleaver can de-correlate initial demodulator errors, thereby maximizing the FEC benefits associated with the code.

TABLE 1

| Data Rate | FEC Rate | Code Length | Range (AWGN) |
|---|---|---|---|
| 9.2 Mbps | ½ | 24 | 29.3 m |
| 28 Mbps | ½ | 24 | 29.4 m |
| 55 Mbps | ½ | 12 | 22.1 m |
| 110 Mbps | ½ | 6 | 18.3 m |
| 220 Mbps | ½ | 3 | 12.9 m |
| 500 Mbps | ¾ | 2 | 7.3 m |
| 660 Mbps | 1 | 2 | 3 m |
| 1000 Mbps | ¾ | 1 | 5 m |
| 1320 Mbps | 1 | 1 | 2 m |

Table 1 shows supported data rates for low band operation in accordance with various exemplary embodiment of the present invention. The information in Table 1 is based on assumptions for range estimates that include transmit power adjustments for code word spectrum (transmit back-off of 1.2-1.9 dB), 6.6 dB CMOS noise figure for receiver, 2.5 dB implementation loss for data rates up to 220 Mbps (3 dB implementation loss for rates >=500 Mbps) and the like.

The UWB signal 101 can be received at an antenna 102 and input to an RF baseband UWB receiver 103 where soft decision decoding as will be understood to those of skill in the art can be performed on baseband signals associated with the UWB signal 101 to generate soft decision data 104 for input to, for example, a correlator/branch metrics block 105. It will be appreciated that during correlation, branch metrics can be generated identifying the Euclidian distance between the actual received signals and the possible combinations of the 2 prospective received code bits. Thus, four branch metric values associated with the four possible combinations of the two soft decision bits are shown as b(11) 106, b(10) 107, b(01) 108 and b(00) 109 are generated in the correlator/branch metrics block 105 and input with their respective distances or metric values to Add Compare Select (ACS) path metric block 110. It will be appreciated that the branch metric values will be used in the ACS path metric block 110 based on a particular butterfly connection associated with the code parameters. Surviving path metrics are calculated in the individual parallel ACS elements as will be described in greater detail herein after.

When a surviving path metric is selected in a parallel connected ACS element, the metric can be pushed into a series of registers in an exemplary track buffer 112 having a number of tracks associated with the number of code states, and which is described in greater detail hereinafter. As more information is received, the surviving path metrics can be pushed using register exchange techniques along the surviving path route within the track buffer 112. The contents of the track buffer 112 which is the subject of the related, co-pending application entitled TRACK BUFFER IN A PARALLEL DECODER" as noted above will converge on a decision regarding the output symbol, that is the symbol regarded by operation of branch metric calculation as the maximum likelihood received symbol. In addition, a voting block 114, can be configured to process the contents of the track buffer 112, such as each of $2^M$ path registers therewithin and determine an output decision symbol for each path register representing the decision regarding the actual received symbol. The track buffer has a depth of τ and thus after a latency associated with τ, a decision block can aggregate the decisions contained in each path register to arrive at the final decision bit. It should be noted that while the present invention is directed primarily decision voting, some aspects of the parallel ACS decoding and track buffering will be discussed but only, for example, as they relate to decision voting.

Figure 2:
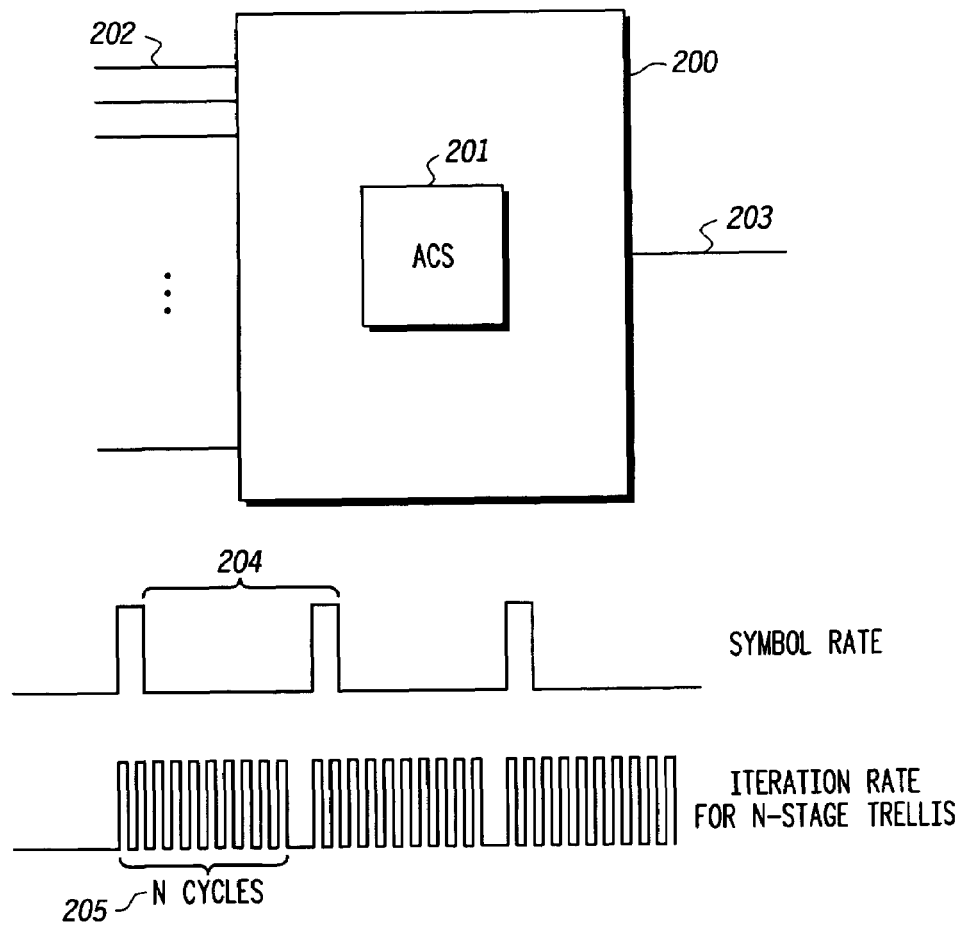
FIG. 2 is a diagram illustrating an exemplary timing relationship between a received symbol rate and iteration rates required for decoding in conventional decoders using Add Compare Select (ACS) elements.

It is important to note that in a conventional trellis decoder, as shown for example in FIG. 2, inputs 202 are applied to a decoder or processor 200 having an iterative ACS path metric calculator 201. A review of the operation of the iterative ACS path metric calculator 201 in comparison to, for example, the output of symbols at output 203, reveals that for symbols output at a symbol rate 204, an n-cycle iteration rate 205 is necessary such that an n-stage trellis can be traversed within the processor 200 in order to generate a decision or output symbol at the symbol rate 204. It can be easily appreciated that for data or symbol rates requiring support under UWB specifications, the n-cycle iteration rate 205 would have to be inordinately fast in order to generate a decision or output symbol at UWB data rates.

It should be also noted that while some documents have described so-called parallel processing cores in relation to ACS decoders, such as in connection with the Institute of Electrical and Electronic Engineering P802.15 working group document P802.15-03/213r0r0, entitled "Implementation of High Speed Signal Processing Cores for 15-3a UWB" dated May 10, 2003, these documents fail to describe a complete parallel connected (butterfly connected) series of ACS elements in connection with, for example, a system where constraint K=6, and thus $2^{M-1}$ parallel connected ACS elements can be present such as in accordance with various exemplary embodiments of the present invention and $2^M$ corresponding path registers in a track buffer configured to store the cumulative path metrics and update register contents based on principals of, for example, register exchange, or the like.

Trellis Decoding

As will also be appreciated by one of ordinary skill in the art, and as more thoroughly described in the co-pending application "PARALLEL DECODER FOR ULTRAWIDE BANDWIDTH RECEIVER" noted above, a trellis diagram is a useful tool for understanding trellis or Viterbi decoding in accordance with various exemplary embodiments. In a code trellis, rows and columns signify states and stages of operation respectively in accordance with the underlying convolutional code and related FSM. When code words are received, several paths through the trellis can be built using hypothetical state transitions assuming the most likely corresponding message symbol associated with the received code word is a "1" and state transitions assuming the most likely corresponding message symbol is a "0". As noted, the rows of an exemplary trellis represent the $2^M$ code states and the columns represent the stages associated with each subsequent received code word during code word intervals. Just as the convolutional encoder, for an exemplary ½ rate code, encoded 2 code symbols (a code word) for each message symbol input to the encoder shift register, the convolutional decoder will attempt to determine the most likely message symbol corresponding to a received code word by calculating metrics associated with each node in the trellis. As the stages are traversed, distance metrics are accumulated and paths with large metrics are abandoned so that by the "end" of the trellis, that is at the last stage, a path traced back through the trellis will reveal the surviving path and the original message sequence. As noted earlier, in a UWB receiver, waiting until all code words are received is impractical due to the limitations posed by processing speed and symbol rate.

Add Compare Select (ACS)

In traversing an exemplary trellis, various constructs can be used to accomplish the required calculations. One construct which, in conventional systems is used in a non-parallel fashion is an exemplary Add Compare Select (ACS) circuit 300 shown in FIG. 3. It will be appreciated that ACS circuit 300 can be used to implement an exemplary trellis node and in a larger context can be connected in parallel with other ACS elements to form a parallel decoder in accordance with various exemplary embodiments. A path metric value $P_{2j}(t-1)$ at 321 and a path metric value $P_{2j+1}(t-1)$ at 322 can be input to an ADD element 301 and an ADD element 302 respectively. Branch metric values, such as a branch metric value $b_{2j,j}(r(t))$ 323 and a branch metric value $b_{2j,j+2}{}^{M-1}(r(t))$ 325 can be input to the ADD element 301 and a branch metric value $b_{2j+1,j+2}{}^{M-1}(r(t))$ 324 and a branch metric value $b_{2j+1,j}(r(t))$ 326 can be input to the ADD element 302 the results of various combinations of calculations for traversed branches can be compared in COMPARE element 303 which can be configured to select using a SELECT line 329 one of a path metric $P_j(t)$ 327 and a path metric $P_{j+2}{}^{M-1}(t)$ 328 as a surviving path.

Parallel ACS

Although as noted, some discussion exists related to the possible feasibility of processing a limited number of samples such as branch metrics, in parallel (see, IEEE P802.15 Working Group for Wireless Personal Area Networks, (WPANs) document P802.15-03/213r0r0, entitled "Implementation of High Speed Signal Processing Cores for 15-3a UWB, May 10, 2003), none shows specifically how parallel decoding is accomplished, and all fail to describe individual ACS units corresponding to decoder states connected in parallel and an associated track buffer to store or otherwise accumulate information associated with a surviving path, decision, or the like, to reduce the iteration rate to a value at or near the symbol rate. The document further admits the existence of limitations, for example at above 240 Mbps even if a basic parallel decoder could be constructed. Also, given the constraints described in various documents in the art, such as K=7, the complexity levels become undesirable as noted, for example, in the discussion herein above. In stark contrast, using the principals discussed and described herein, a track buffer associated with a parallel trellis decoder can be constructed for providing full symbol rate decoding at 480 Mbps and potentially beyond.

Figure 3:
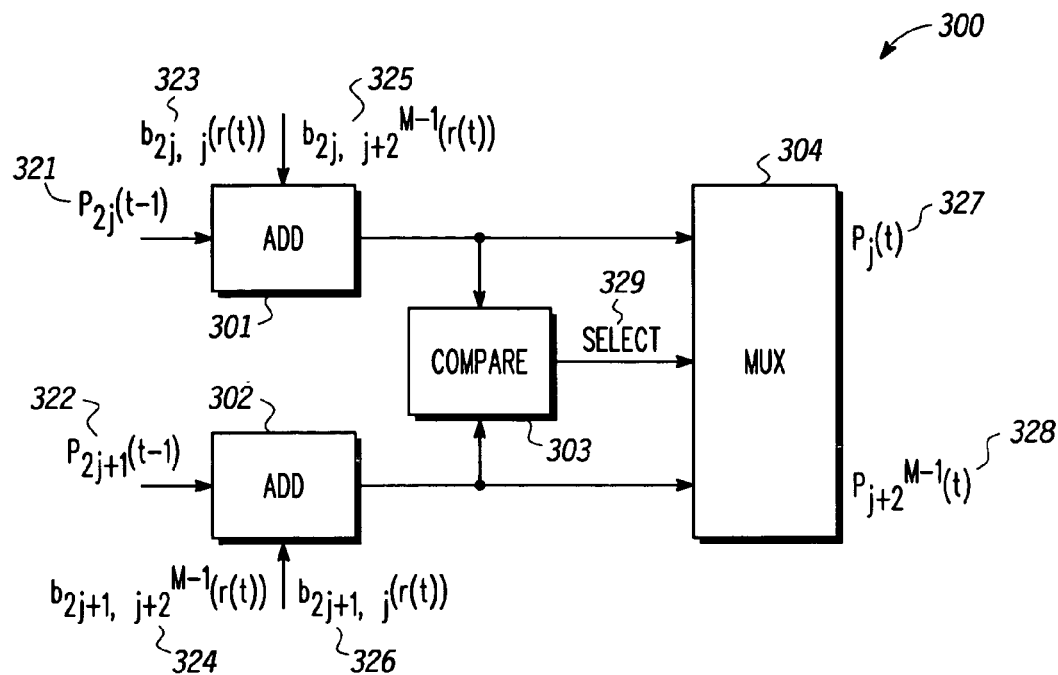
FIG. 3 is a block diagram illustrating inputs to an exemplary Add Compare Select (ACS) element associated with an exemplary trellis node in accordance with various exemplary embodiments of the present invention.
Figure 4:
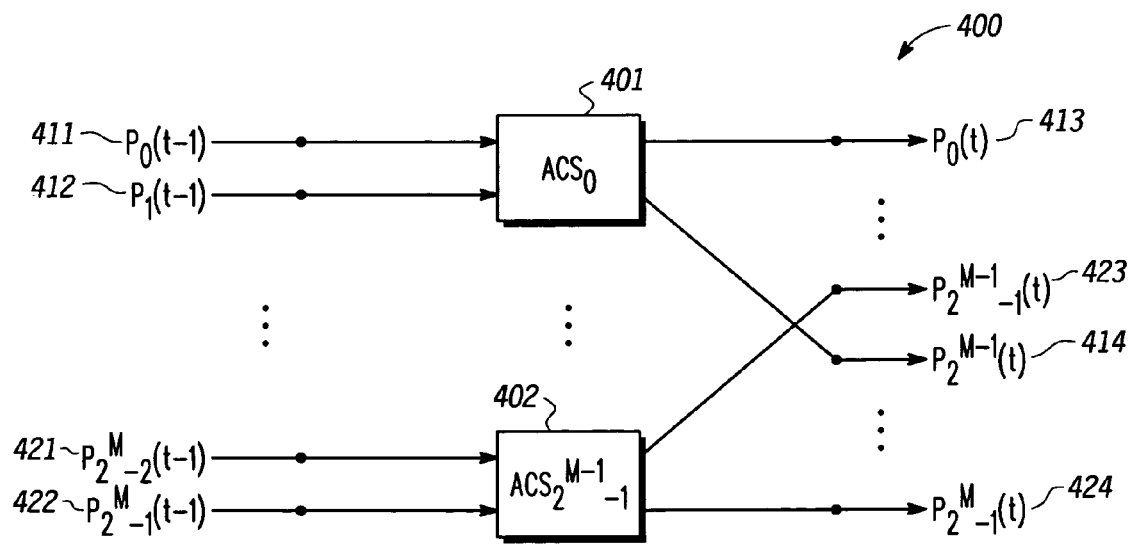
FIG. 4 is a block diagram illustrating exemplary parallel ACS elements associated with parallel decoding in accordance with various exemplary embodiments of the present invention.

FIG. 4 illustrates an exemplary parallel ACS circuit 400 constructed for implementation in, for example, an integrated circuit in a UWB receiver or receiver section such as the ACS branch metrics unit 110 described herein above. In the parallel ACS circuit 400, a series of parallel ACS elements from a first $ACS_0$ element 401 through a $(M-1)^{th}$ $ACS_2{}^{M-1}{}_{-1}$ element 402 can receive respective parallel path metric inputs $P_0(t-1)$ 411, $P_1(t-1)$ 412 and $P_2{}^M{}_{-2}(t-1)$ 421, $P_2{}^M{}_{-1}(t-1)$ 422. Each of the parallel ACS elements such as the $ACS_0$ element 401 and the $ACS_2{}^M{}_{-1}$ element 402, after computing branch metrics in the manner described above in connection with FIG. 3, generate parallel path outputs $P_0(t)$ 413, $P_2{}^{M-1}(t)$ 414 and $P_2{}^{M-1}{}_{-1}(t)$ 423, $P_2{}^M(t)$ 424 which are shown schematically as an open form version of, for example, a butterfly connection. It will be appreciated that the exact configuration of the butterfly connection between ACS elements will depend on, for example, specific design factors such as the particular generator polynomials chosen for the convolutional code. However, it is contemplated that the diagram shown, for example, in FIG. 4, will encompass any such particular case so long as the general principles, concepts, conditions, and the like in accordance with various exemplary embodiments are met as discussed and described herein.

Track Buffer

Figure 5:
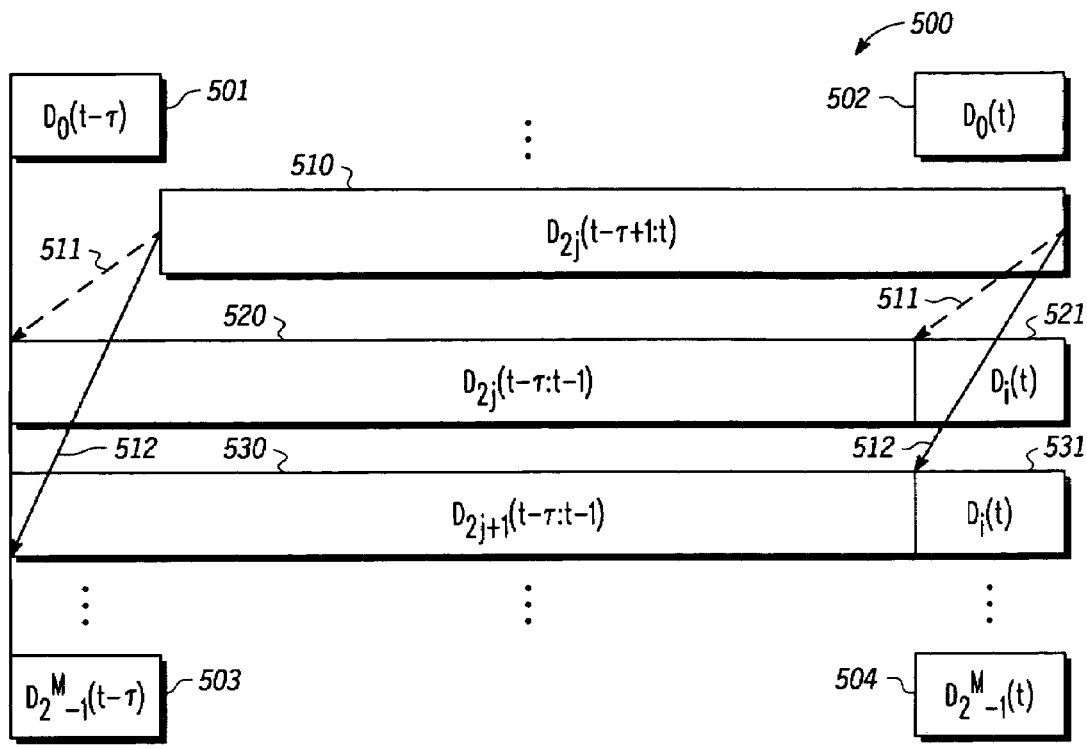
FIG. 5 is a diagram illustrating an exemplary track buffer in accordance with various exemplary embodiments of the present invention.

The track buffer 500, shown in FIG. 5, can be used to receive the results of the $2^{M-1}$ parallel connected ACS units associated with parallel ACS circuit 400 shown in FIG. 4.

When results are generated from, for example, add elements 301 and 302 of ACS unit 300 of FIG. 3, in the form of, for example, $2^M$ path metric values, the path metric values can be stored in the track buffer 500 in corresponding $2^M$ registers including exemplary registers 501-504 as will be described. As path metric values are generated through the operation of the parallel ASC circuit 400, the values can be accumulated in, for example, buffer 510. The accumulated path metric values can be pushed into buffer 520 or buffer 530 through register exchange depending on the value associated with the surviving path selection and, for example, the branch metric value with path 511 representing one of two possible values for the selection and path 512 representing the other of two possible values for the selection. The current selections for the corresponding registers are reflected in current register 521 or 531 depending on where the previous results were pushed. It will be appreciated that the track buffer will have a depth of $\tau$ which can be around 100 to around 150 representing the number of spin cycles for the track buffer to perform register exchange and the like. It should be noted that the clock rate for an exemplary processor in accordance with various embodiments, is 8.8 nanoseconds and further the track buffer may be provided with a spin signal such as a clock signal, cycle signal, or the like at around the processor clock speed to allow the contents of the track buffer to be updated through register exchange or the like. While the track buffer depth $\tau$ represents a latency in the decision processing for the decoder, it is power efficient in that the buffer contents are exchanged as opposed to iterative and computationally intensive ACS calculations. In an additional step, the accumulated decisions may be voted on to arrive at the most likely decision symbol which is described in greater detail hereinbelow.

Decision Voting

Figure 6:
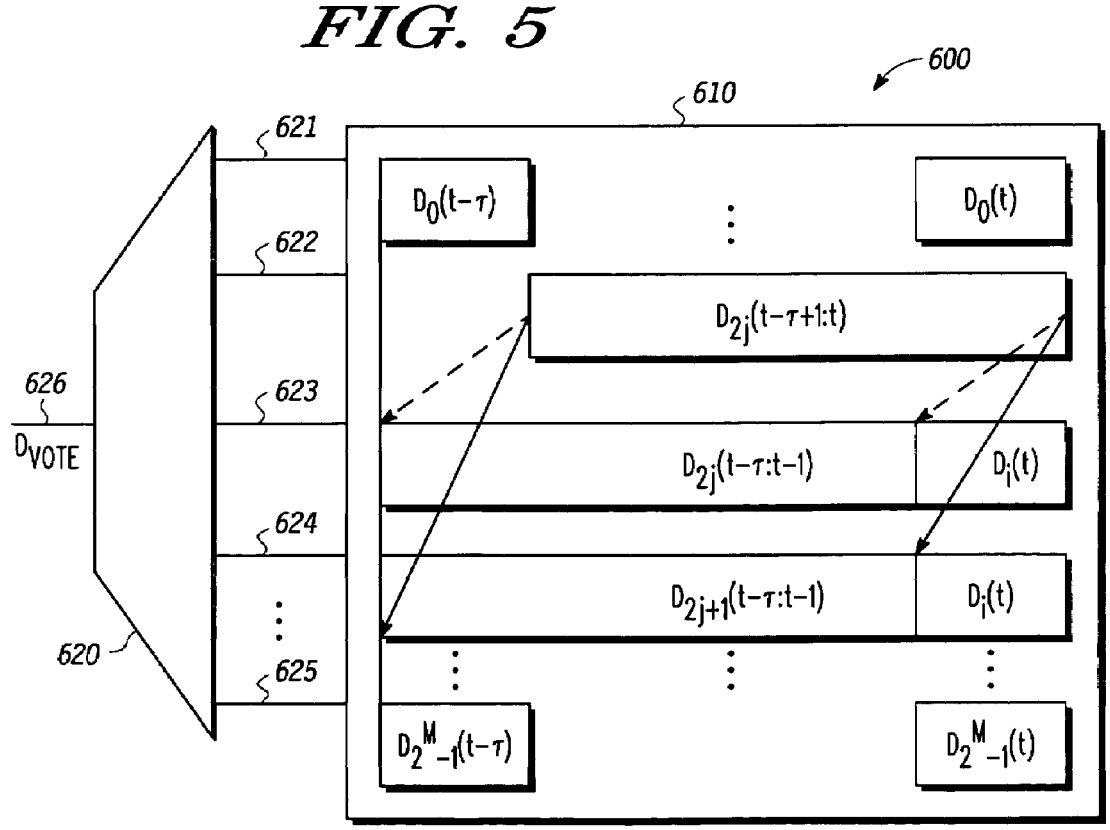
FIG. 6 is a diagram illustrating an exemplary voting unit coupled to the output of the exemplary track buffer of FIG. 5 in accordance with various exemplary embodiments of the present invention.

In accordance with various exemplary embodiments, an exemplary decision voting configuration 600 is shown in FIG. 6. As noted above, track buffer 610 can generate and accumulate results from parallel ACS computation as described above, for example, with reference to FIG. 3 and FIG. 4, and FIG. 5. For each of the $2^M$ path registers or tracks, corresponding to for example path metric outputs of the add units of the $2^{M-1}$ parallel connected ACS units, or alternatively outputs 413, 414, 423 and 424 of FIG. 4, outputs 621-625 can be coupled to a voting unit 620 where a statistical scheme may be used such as a simple majority voting scheme, or the like, to determine a final decision bit 626 representing for example the actual received symbol.

Figure 7:
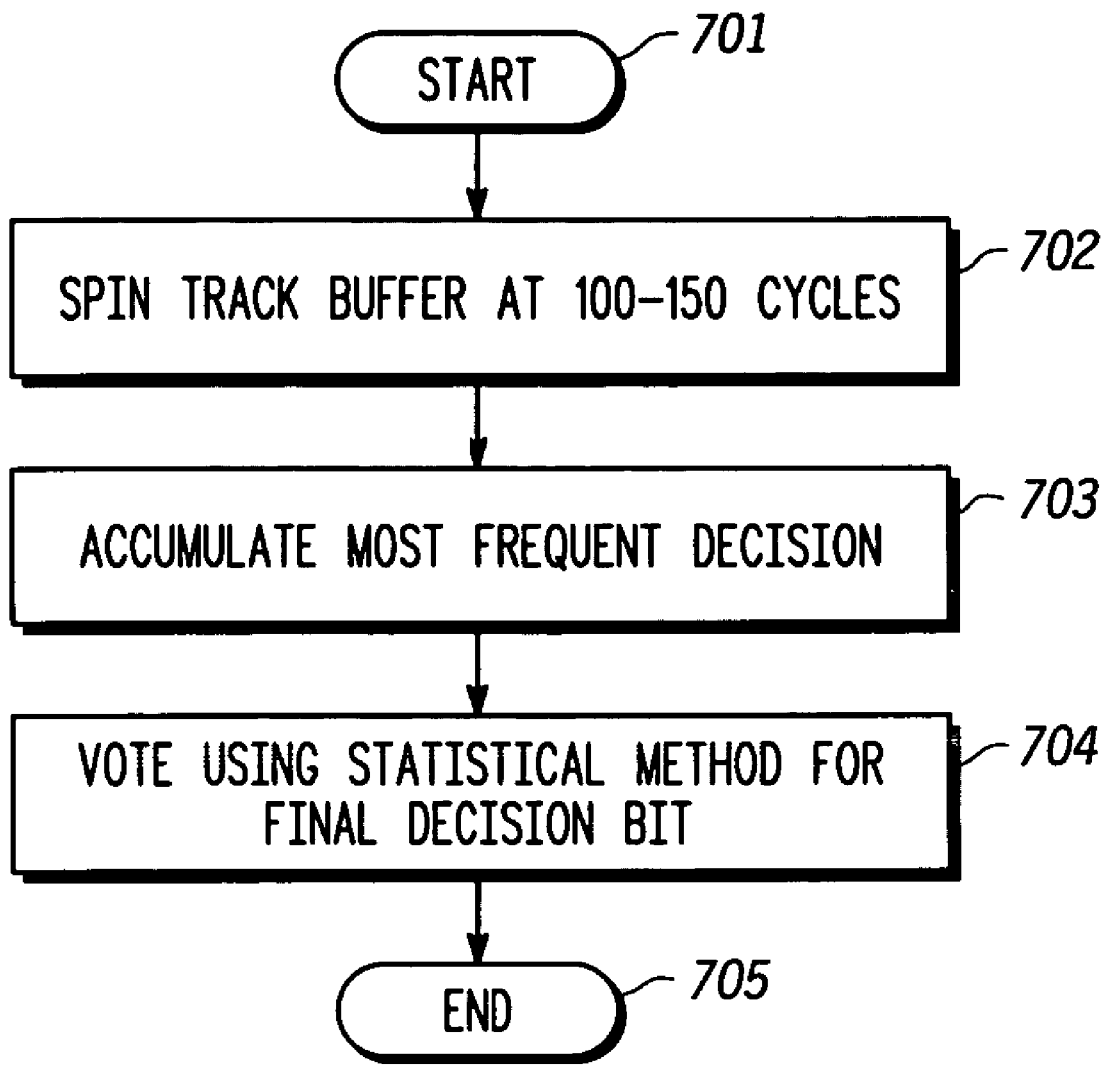
FIG. 7 is a flow chart illustrating exemplary procedures in accordance with various exemplary embodiments of the present invention.

Thus it will be appreciated that in accordance with various exemplary embodiments, the present invention can be practiced as an exemplary procedure, such as procedure 700 as illustrated in FIG. 7. At start 701, it can be determined whether new decision values, or the like, have been received from the track buffer at 702. For illustrative purposes, in determining whether new decision values have been received, it will suffice that the new decision values will be available at the output of an exemplary track buffer such as the track buffer 112 after the buffer depth $\tau$ has been spun through, as described hereinabove in accordance with a spin rate, track buffer clock rate, cycle rate, or the like for the decoder as should be apparent to one of ordinary skill in the art after reading the description herein. At 703, the decision values for each of the tracks can be input to the voting unit. The decision values for all the tracks can be voted on as noted above, using a voting scheme such as a simple majority voting scheme or the like, or a suitable probabilistic scheme at 704. Although at 705 the procedure is indicated as ending, it will be appreciated that a single "iteration" is shown for illustrative purposes. It is understood that the procedure in accordance with various exemplary embodiments, can continue to repeat, for example, as new decision values are generated in track buffer 112.

Additional Modifications

As noted above, the present disclosure illustrates and describes an exemplary parallel trellis decoder with $2^{M-1}$ parallel ACS elements and a track buffer for use in a high-speed UWB environment. It will be appreciated that while various values for K and M have been described such as K=6 (M=5), and K=4 (M=3) for illustrative purposes for example, in the figures, different values of K can be used without departing from the invention. It will also be appreciated that the particular implementation of the decoder will be specific to the underlying convolutional code used, for example, to encode symbol sequences and, for a particular value of K, there may be many possible generator polynomials which can be used in an encoder to yield slightly different codes. However, use of $2^{M-1}$ parallel ACS units and corresponding track buffer is consistent with the present invention and any of the slight differences noted above resulting in, for example, slightly different connections can be considered to are intended to fall within the scope of the present invention.

CONCLUSIONS

The disclosed DS-UWB design provides scalable performance across a wide range of application requirements. This design leads to significant reductions in implementation complexity as compared to other proposed UWB PHY designs, while allowing increased scalability to high data-rate and low-power applications. This means that performance for applications such as high-rate data transfers for power-constrained handheld devices can significantly improved relative to current UWB PHY proposals. At the same time, the DS-UWB approach benefits from the significant benefits of true UWB operation, i.e., low fading in multipath, optimal interference characteristics, inherent frequency diversity and precision ranging capabilities.

Although this disclosure discusses a UWB device using the IEEE 802.15.3a standard by way of example, the general design is also applicable to other wireless networks, and should not be considered to be limited to application with respect to IEEE 802.15.3a networks. It should further be noted that while the present invention is applicable to trellis decoding in a UWB device which operates at different speeds and in different modes, the present invention should not be limited to any particular type of decoding operation, but can be used in any decoding situation where a convolutionally encoded symbol is present and for which its features would be advantageous This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. An integrated circuit capable of conducting a decoding operation on a received sequence of n symbols associated with an Ultra Wide Band (UWB) transmission, the received sequence presumed to include an encoded representation of a message sequence of k symbols encoded according to a convolutional code of rate k/n having a constraint K and having $2^M$ code states, where M is equal to K−1, the received sequence received according to a symbol rate associated with the message sequence, the integrated circuit comprising:
a track buffer including $2^M$ path registers configured to be capable of storing $2^M$ path metrics associated with the output of $2^{M-1}$ parallel Add Compare Select (ACS) elements; and
a voting unit configured to be capable of generating a decision bit based on the contents of the $2^M$ path registers by voting for the decision bit according to a voting protocol,
wherein each of the $2^M$ path registers has a depth of around 100 to around 150 spin cycles.

2. An integrated circuit, as recited in claim 1, wherein the voting unit, in being configured to be capable of generating a decision bit is further configured to generate the decision bit by cycling the each of the $2^M$ path registers around 100 to around 150 times and wherein the voting protocol includes generating the decision bit based on the contents of a majority of the $2^M$ path registers after the cycling.

3. An integrated circuit, as recited in claim 1, wherein the decoding operation includes one of a maximum likelihood (ML) decoding operation and a maximum a posteriori (MAP) decoding operation 4. An integrated circuit, as recited in claim 1, wherein K=6.

5. An integrated circuit, as recited in claim 1, wherein the track buffer is a parallel track buffer.

6. A method for decoding a received sequence of n symbols associated with an Ultra Wide Band (UWB) transmission, the received sequence presumed to include an encoded representation of a message sequence of k symbols encoded according to a convolutional code of rate n/k having a constraint K and having $2^M$ code states, where M is equal to K−1, the sequence received according to a symbol rate, the method comprising:
storing $2^M$ path metric values in $2^M$ path registers associated with a track buffer, the $2^M$ path metric values generated during $2^{M-1}$ parallel Add Compare Select (ACS) operations; and
generating a decision bit by applying a voting procedure to a decision related content associated with each of the $2^M$ path registers,
the generating the decision bit further includes cycling the each of the $2^M$ path registers around 100 to around 150 times; and
the voting procedure includes generating the decision bit based on the contents of a majority of the $2^M$ path registers after the cycling.

7. A method, as recited in claim 6, wherein each of the $2^M$ path registers has a depth of around 100 to around 150 spin cycles.

8. A method, as recited in claim 6, wherein K=6.

9. A method, as recited in claim 6, wherein the decoding includes one of a maximum likelihood (ML) decoding and a maximum a posteriori (MAP) decoding.

10. A method, as recited in claim 6, wherein the track buffer is a parallel track buffer.

11. An apparatus configured to be capable of conducting a decoding operation on received sequence of n symbols associated with an Ultra Wide Band (UWB) transmission, the received sequence presumed to include an encoded representation of a message sequence of k symbols encoded according to a convolutional code of rate k/n, the convolutional code having a constraint K and having $2^M$ code states, where M=K−1, the apparatus comprising:
a memory, and
a processor coupled to the memory, the processor configured to:
store $2^M$ path metric values associated with $2^{M-1}$ parallel ACS operations in $2^M$ path registers allocated in the memory; and
generate a decision bit based on a voting procedure applied to the $2^M$ path registers,
wherein each of the $2^M$ path registers has a depth of around 100 to around 150 spin cycles.

12. An apparatus, as recited in claim 11, wherein:
the processor, in the generating the decision bit is further configured to cycle the each of the $2^M$ path registers a number of times; and
the voting procedure includes the generating the decision bit based on the contents of a majority of the $2^M$ path registers after the cycling.

13. A method, as recited in claim 11, wherein K=6.

14. A method, as recited in claim 11, wherein the decoding includes one of a maximum likelihood (ML) decoding and a maximum a posteriori (MAP) decoding.

* * * * *